(12) United States Patent
Fatemi et al.

(10) Patent No.: US 12,287,358 B2
(45) Date of Patent: Apr. 29, 2025

(54) CURRENT SENSING APPARATUS

(71) Applicant: GM Global Technology Operations LLC, Detroit, MI (US)

(72) Inventors: Alireza Fatemi, Canton, MI (US); Muhammad Hussain Alvi, Troy, MI (US); Thomas W. Nehl, Shelby Township, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 270 days.

(21) Appl. No.: 17/946,332

(22) Filed: Sep. 16, 2022

(65) Prior Publication Data

US 2024/0094267 A1    Mar. 21, 2024

(51) Int. Cl.
*G01R 19/18*    (2006.01)
*B60L 3/12*    (2006.01)

(52) U.S. Cl.
CPC .............. *G01R 19/18* (2013.01); *B60L 3/12* (2013.01); *B60L 2210/44* (2013.01)

(58) Field of Classification Search
CPC ........ G01R 19/18; B60L 3/12; B60L 2210/44
USPC ..... 324/500, 553, 415–417, 425–437, 76.11, 324/600
See application file for complete search history.

(56) References Cited

U.S. PATENT DOCUMENTS

| | | | |
|---|---|---|---|
| 6,335,673 B1 * | 1/2002 | Houbre ................. | H01F 27/245 336/216 |
| 11,226,382 B2 * | 1/2022 | Augendre ............. | G01R 33/09 |
| 11,493,361 B2 * | 11/2022 | Romero ................. | G01D 5/14 |
| 2006/0232262 A1 * | 10/2006 | Tanizawa ............. | G01R 15/183 324/117 H |
| 2012/0032674 A1 * | 2/2012 | Rajula .................... | G01R 33/04 324/253 |
| 2012/0268114 A1 * | 10/2012 | Disselnkotter ....... | G01R 15/207 324/253 |
| 2014/0184212 A1 * | 7/2014 | Yamaguchi ........... | G01R 15/207 324/244 |
| 2015/0108967 A1 * | 4/2015 | Barczyk ................ | G01R 15/185 324/202 |
| 2018/0197673 A1 * | 7/2018 | Njiende .................. | H01F 3/10 |
| 2021/0311136 A1 * | 10/2021 | Augendre .......... | G01R 19/0092 |

* cited by examiner

*Primary Examiner* — Huy Q Phan
*Assistant Examiner* — Trung Q Nguyen
(74) *Attorney, Agent, or Firm* — CANTOR COLBURN LLP

(57) ABSTRACT

A current sensing apparatus may include a common mode core surrounding two or more current conductors and a current sensing element proximate the common mode core.

20 Claims, 8 Drawing Sheets

CURRENT SENSING APPARATUS

INTRODUCTION

The subject disclosure relates to inverter controlled rotary electric machines.

It is desirable to measure current in DC and/or AC buses carrying electrical power to and from a multi-phase power inverter for control and diagnostic purposes. Current sensors may include current sensing elements placed near current carriers such as DC bus conductors or AC bus conductors, including bus bars, cables, rails, rods or other conductors. Current sensors may employ closed or open ferrous cores to concentrate flux to and/or shield current sensing elements from stray magnetic influences.

It is generally desirable to minimize the overall length of DC and AC buses and to minimize overall system mass. DC and AC buses may be configured with various sub-sections making up the overall bus length. Thus, each sub-section of a bus is desirably minimized in length. Current sensors require some finite packaging volume including some finite length of some portion of the bus conductors. Current sensing cores may contribute mass and require packaging dimensions, including length of the buses.

Power inverters coupled between a DC bus and an AC bus may induce noise/parasitic current on each bus related to the power inverter switching frequency and the resultant dv/dt and di/dt. Such noise is generally undesirable and may cause issues on the DC input side of the power inverter including electromagnetic interference (EMI) and on the AC output side of the power inverter including EMI and induced parasitic currents within the machine structures. Induced currents within the machine structures may be undesirable. Therefore, it is desirable to measure and reduce such bus induced currents, preferably without increasing system mass or packaging dimensions, including length of the buses.

SUMMARY

In one exemplary embodiment, a current sensing apparatus, may include a common mode core surrounding two or more current conductors, and a current sensing element proximate the common mode core.

In addition to one or more of the features described herein, the current sensing element may be within the common mode core for measuring a common mode current of the two or more current conductors.

In addition to one or more of the features described herein, the current sensing element may be outside the common mode core for measuring a differential mode current of one of the two or more current conductors.

In addition to one or more of the features described herein, the current sensing apparatus may further include a plurality of differential mode cores sharing common magnetic structure with the common mode core, wherein each differential mode core may include a respective current sensing element proximate the corresponding differential mode core.

In addition to one or more of the features described herein, the respective current sensing elements may be within the corresponding differential mode cores for measuring differential mode currents of the two or more current conductors.

In addition to one or more of the features described herein, the respective current sensing elements may be outside the corresponding differential mode cores for measuring differentials mode currents of the two or more current conductors.

In addition to one or more of the features described herein, the current sensing apparatus may further include a plurality of differential mode cores not sharing common magnetic structure with the common mode core, wherein each differential mode core may include a respective current sensing element proximate the corresponding differential mode core.

In addition to one or more of the features described herein, the respective current sensing elements may be within the corresponding differential mode cores for measuring differential mode currents of the two or more current conductors.

In addition to one or more of the features described herein, the respective current sensing elements may be outside the corresponding differential mode cores for measuring differentials mode currents of the two or more current conductors.

In addition to one or more of the features described herein, the plurality of differential mode cores may not share common magnetic structure with any other of the plurality of the differential mode cores.

In another exemplary embodiment, a current sensing apparatus for an electrified vehicle may include a traction power inverter module ("TPIM") configured to change a direct current ("DC") voltage on a DC bus to a multi-phase alternating current ("AC") voltage on an AC bus, a common mode core surrounding one of the DC bus and the AC bus, and a current sensing element proximate the common mode core.

In addition to one or more of the features described herein, the current sensing apparatus for an electrified vehicle may further include a plurality of differential mode cores sharing common magnetic structure with the common mode core, wherein each differential mode core may include a respective current sensing element proximate the corresponding differential mode core.

In addition to one or more of the features described herein, the respective current sensing elements may be within the corresponding differential mode cores for measuring differential mode currents of the one of the DC bus and the AC bus.

In addition to one or more of the features described herein, the respective current sensing elements may be outside the corresponding differential mode cores for measuring differentials mode currents of the one of the DC bus and the AC bus.

In addition to one or more of the features described herein, the current sensing apparatus for an electrified vehicle may further include a plurality of differential mode cores not sharing common magnetic structure with the common mode core, wherein each differential mode core may include a respective current sensing element proximate the corresponding differential mode core.

In addition to one or more of the features described herein, the respective current sensing elements may be within the corresponding differential mode cores for measuring differential mode currents of the one of the DC bus and the AC bus.

In addition to one or more of the features described herein, the respective current sensing elements may be outside the corresponding differential mode cores for measuring differentials mode currents of the one of the DC bus and the AC bus.

In addition to one or more of the features described herein, the plurality of differential mode cores may not share common magnetic structure with any other of the plurality of the differential mode cores.

In yet another exemplary embodiment, a current sensing apparatus for an electrified vehicle may include a traction power inverter module ("TPIM") configured to change a direct current ("DC") voltage on a DC bus to a multi-phase alternating current ("AC") voltage on an AC bus having a plurality of current conductors, an integrated core including a common mode core and a plurality of differential mode cores, the common mode core surrounding all current conductors of the AC bus, and each of the plurality of differential mode cores surrounding a respective one of the plurality of the current conductors of the AC bus, and a respective differential mode current sensing element proximate each differential mode core for measuring a corresponding differential mode current of the respective one of the plurality of the current conductors of the AC bus surrounded by the corresponding differential mode core.

In addition to one or more of the features described herein, the current sensing apparatus for an electrified vehicle may further include a common mode current sensing element proximate the common mode core for measuring a common mode current of the plurality of the current conductors of the AC bus surrounded by the common mode core.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
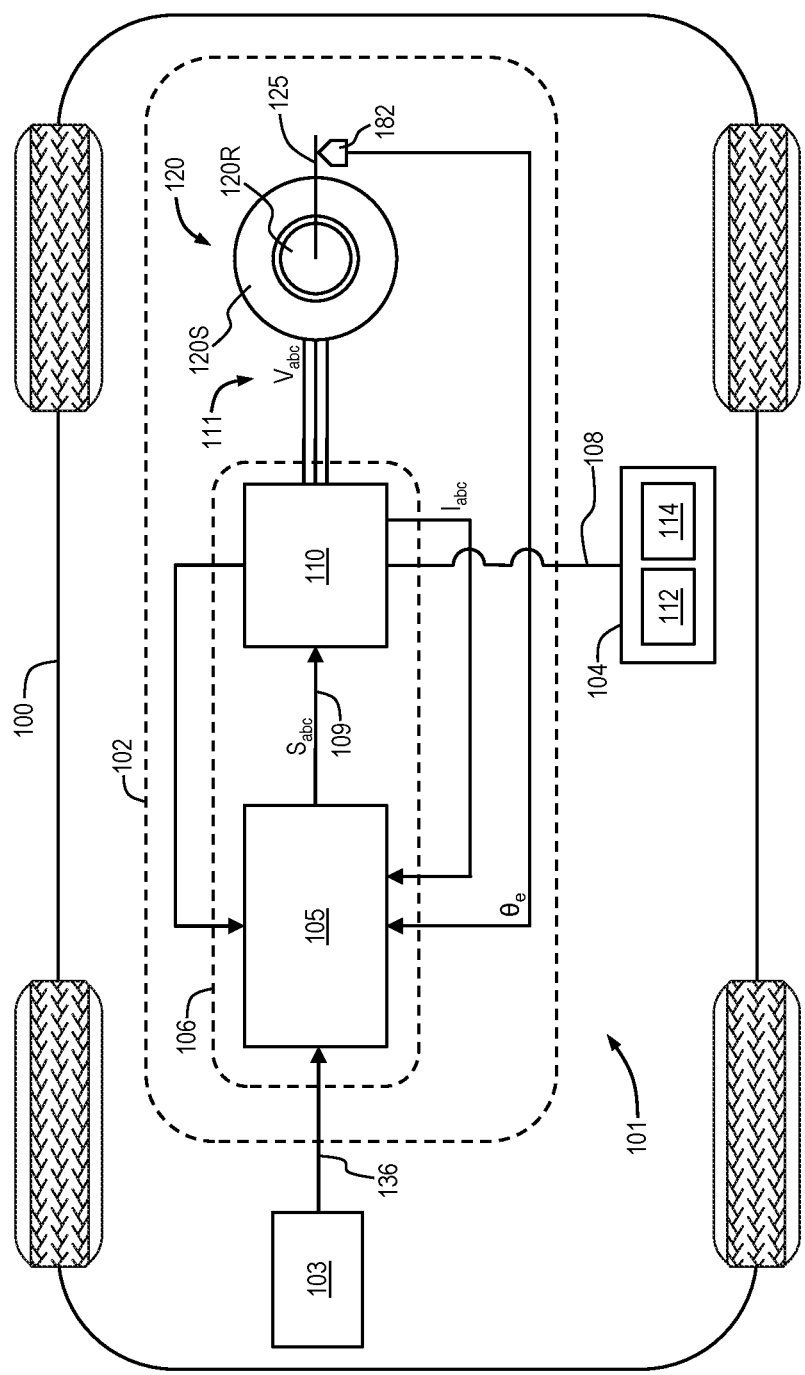
FIG. 1 illustrates an electrified vehicle, in accordance with one or more embodiments.

The following description is merely exemplary in nature and is not intended to limit the present disclosure, its application or uses. Throughout the drawings, corresponding reference numerals indicate like or corresponding parts and features.

FIG. 1 schematically illustrates an embodiment of an electric propulsion system 101 in a vehicle 100. Vehicle and vehicular are understood to refer to any means of transportation including non-limiting examples of motorcycles, cars, trucks, buses, excavation, earth moving, construction and farming equipment, railed vehicles like trains and trams, and watercraft like ships and boats. The electric propulsion system 101 may include various control components, electrical systems and electro-mechanical systems including, for example, a rechargeable energy storage system (RESS) 104 and an electric drive unit (EDU) 102. The electric propulsion system 101 may be employed on a powertrain system to generate propulsion torque as a replacement for, or in conjunction with, an internal combustion engine in various electric vehicle (EV) applications and hybrid electric vehicle (HEV) applications, respectively.

The EDU 102 may be of varying complexity, componentry and integration. An exemplary highly integrated EDU 102 may include, for example, a rotary electric machine such as an alternating current (AC) motor (motor) 120 and a traction power inverter module (TPIM) 106 including a motor controller 105 and a power inverter 110. The motor 120 may include a stator 120S and a rotor 120R coupled to a motor output shaft 125 and position sensor 182, for example a variable reluctance resolver or an encoder. The position sensor 182 may signally connect directly to the motor controller 105 and is employed to monitor angular position of the rotor ($\theta_e$) of the motor 120. The angular position of the rotor ($\theta_e$) of the motor 120 is employed by the motor controller 105 to control operation of the power inverter 110 that controls the motor 120.

The motor output shaft 125 may transfer torque between the motor 120 and driveline components (not illustrated), some of which may be integrated within the EDU 102, for example in a gearbox including reduction and differential gear sets and one or more axle outputs. The gearbox may simply include reduction gearing and a prop shaft output for coupling to a differential gear set. One or more axles may couple to the gear box directly or through final drive or differential gear sets if separate therefrom. Axle(s) may couple to a vehicle wheel(s) for transferring tractive force between a wheel and pavement. One having ordinary skill in the art will recognize alternative arrangements for driveline components. Propulsion torque requests or commands 136 ($T_{cmd}$) may be provided by a vehicle controller 103 to the motor controller 105.

Any controller may include one or more control modules. As used herein, control module, module, control, controller, control unit, electronic control unit, processor and similar terms mean any one or various combinations of one or more of Application Specific Integrated Circuit(s) (ASIC), electronic circuit(s), central processing unit(s) (preferably microprocessor(s)) and associated memory and storage (read only memory (ROM), random access memory (RAM), electrically programmable read only memory (EPROM), hard drive, etc.) or microcontrollers executing one or more software or firmware programs or routines, combinational logic circuit(s), input/output circuitry and devices (I/O) and appropriate signal conditioning and buffer circuitry, high speed clock, analog to digital (A/D) and digital to analog (D/A) circuitry and other components to provide the described functionality. A control module may include a variety of communication interfaces including point-to-point or discrete lines and wired or wireless interfaces to networks including wide and local area networks, and in-plant and service-related networks including for over the air (OTA) software updates. Functions of a control module as set forth in this disclosure may be performed in a distributed control architecture among several networked control modules. Software, firmware, programs, instructions, routines, code, algorithms and similar terms mean any controller executable instruction sets including calibrations, data structures, and look-up tables. A control module may have a set of control routines executed to provide described functions. Routines are executed, such as by a central processing unit, and are operable to monitor inputs from sensing devices and other networked control modules and execute control and diagnostic routines to control operation of actuators. Routines may be executed at regular intervals during ongoing powertrain and vehicle operation. Alternatively, routines may be executed in response to occurrence of an event, software calls, or on demand via user interface inputs or requests.

The RESS 104 may, in one embodiment, include one or more electro-chemical battery packs 112, for example high capacity, high voltage (HV) rechargeable lithium ion battery packs for providing power to the vehicle via a HV direct current (DC) bus 108. The RESS 104 may also include a battery manager module 114. The RESS 104 may include one or more battery packs 112 constructed from a plurality of battery pack modules allowing for flexibility in configurations and adaptation to application requirements. Battery packs may include a plurality of battery pack modules constructed from a plurality of cells allowing for flexibility in configurations and adaptation to application requirements. Battery pack modules may include a plurality of cells allowing for flexibility in configurations and adaptation to application requirements. For example, in vehicular uses, the RESS 104 may be modular to the extent that the number of battery pack modules may be varied to accommodate a desired energy density or range objective of a particular vehicle platform, intended use, or cost target. Battery packs and battery pack modules may be variously and selectively configured in accordance with desired propulsion architecture and charging functions. It is understood that the RESS 104 may be reconfigurable at any level of integration including battery pack, battery module and cell.

The motor 120 may be a multi-phase AC motor receiving multi-phase AC power over a multi-phase motor control power bus (AC bus) 111 which is coupled to the power inverter 110. In one embodiment, the motor 120 is a three-phase motor and the power inverter 110 is a three-phase inverter. The power inverter 110 may include a plurality of solid-state switches in a solid-state switching section. The power inverter 110 couples to DC power over the HV DC bus 108 (DC input voltage ($V_{dc}$)) from the RESS 104, for example at 400 or 800 volts. The motor controller 105 is coupled to the power inverter 110 for control thereof. The power inverter 110 electrically connects to stator phase windings of a three-phase stator winding of the motor 120 via the AC bus 111, with electric current ($I_{abc}$) monitored on two or three phases thereof. The power inverter 110 may be configured with suitable control circuits including paired power transistors (e.g., IGBTs) for transforming high-voltage DC voltage on the HV DC bus 108 to high-voltage three-phase AC voltage ($V_{abc}$) on the AC bus 111 and transforming high-voltage three-phase AC voltage ($V_{abc}$) on the AC bus 111 to high-voltage DC voltage on the HV DC bus 108. The power inverter 110 may employ any suitable pulse width modulation (PWM) control, for example sinusoidal pulse width modulation (SPWM) or space vector pulse width modulation (SVPWM), to generate switching vector signals ($S_{abc}$) 109 to convert stored DC electric power originating in the battery pack 112 of the RESS 104 to AC electric power to drive the motor 120 to generate torque. Similarly, the power inverter 110 may convert mechanical power transferred to the motor 120 to DC electric power to generate electric energy that is storable in the battery pack 112 of the RESS 104, including as part of a regenerative braking control strategy. The power inverter 110 may be configured to receive the switching vector signals ($S_{abc}$) 109 from motor controller 105 and control inverter states to provide the motor drive and regeneration functionality. Switching vector signals ($S_{abc}$) 109 may also be referred to herein as conduction commands.

Control of the power inverter 110 may include high frequency switching of the solid-state switches in accordance with the PWM control. A number of design and application considerations and limitations determine inverter switching frequency and PWM control. Inverter controls for AC motor applications may include fixed switching frequencies, for example switching frequencies around 10-30 kHz and PWM controls that minimize switching losses of the IGBTs or other power switches of the power inverter 110.

The power inverter 110 operates by synthesizing multi-phase AC voltages which are applied to corresponding phase windings of the multi-phase stator 120S of the motor 120 over the AC bus 111. In addition to the fundamental voltages output onto the AC bus 111, there may be parasitic excitations as a result of non-ideal waveforms. In a balanced three phase system, for example, the three fundamental AC voltages may be substantially sinusoidal and separated by 120 degrees. The summation of the three phase voltages would be equal to zero in an ideal system. However, the power inverter 110 operates by high frequency switching of a DC voltage to synthesize sinusoidal voltages over time. Instantaneous voltages on the AC bus 111 and at the stator phase windings may appear as square waveforms whose summations may not equal zero, thus resulting in high frequency excitations within the motor 120 manifesting in common mode voltages on the stator phase windings at frequencies related to the high frequency switching. Common mode voltages may induce undesirable EMI and undesirable circulating currents in the motor structure High frequency switching in the solid-state switching section of the power inverter 110 may similarly induce undesirable high frequency content common mode voltage on the HV DC bus 108 leading to undesirable EMI and undesirable voltage excursions that may affect battery pack state of charge management.

The disclosed improvements relate to addressing common mode voltage and current, for example on DC and AC power buses on the input and output sides of a power inverter, and to current sensing of common mode and differential mode currents in DC and AC conductors. Common mode effects may be attenuated through the introduction of a filter in the form of a common mode choke surrounding all phase conductors on the AC side of the power inverter and/or a separate common mode choke surrounding both DC conductors on the DC side of the power inverter. All conductors of the AC bus and/or the DC bus may be coupled to a common mode choke and hence the common mode chokes are effective upon the common mode currents. The addition of a common mode choke to the AC bus and/or the DC bus may increase the impedance of the common mode path at select frequencies thereby attenuating the common mode currents. In accordance with embodiments described herein, impact on mass and packaging volume is addressed through physical and functional combinations of common mode and differential current sensing hardware with the common mode choke hardware.

Figure 2:
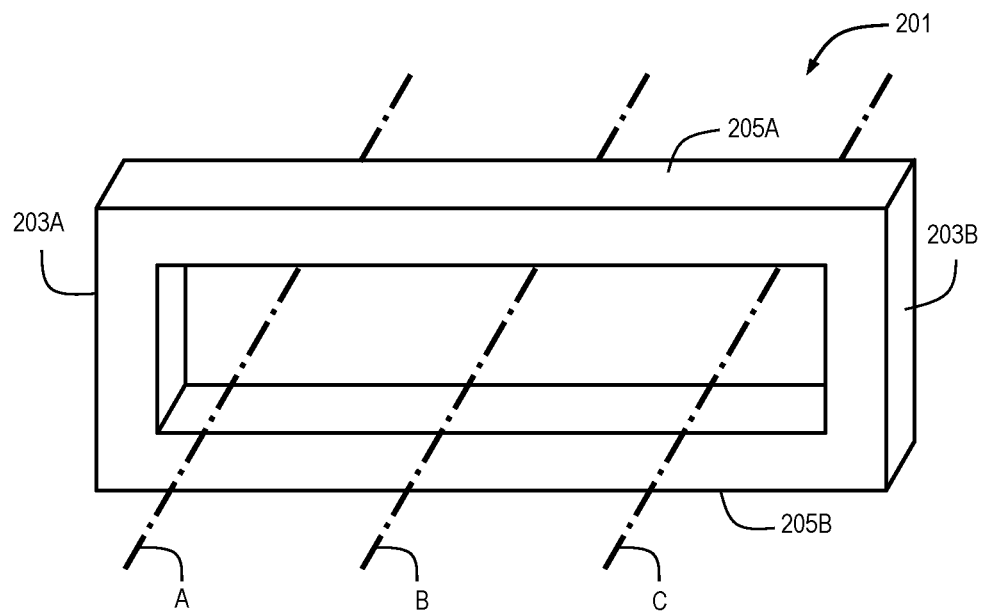
FIG. 2 illustrates a common mode core and current conductors, in accordance with one or more embodiments.

FIG. 2 illustrates an embodiment of a common mode core 201 surrounding three conductor bars A, B and C. The three conductor bars may represent three phase conductors of an AC bus at the output side of a power inverter. Core as used herein refers to a magnetic structure defining a looped flux path which may be closed or include air gaps. The common mode core 201 of FIG. 2 is closed. The common mode core 201 is referred to as a common mode core since it surrounds all three current conductors A, B and C wherein the net magnetic flux induced in the core by the primary currents flowing in the conductors is zero in a balanced multi-phase bus. Thus, flux generated in the core is the result of parasitic currents in the conductors. For purposes of this disclosure, any core that surrounds all conductors of the AC bus or both conductors of the DC bus is considered to be a common mode core. The common mode core 201 may be substantially rectangular and includes a pair of opposing short sides 203A and 203B and a pair of opposing long sides 205A and 205B as illustrated in FIG. 2. Common mode cores may be other than rectangular, for example circular or elliptical. The shapes of the surrounded conductors as well as packaging considerations may influence the shapes of the common mode core.

Figure 3:
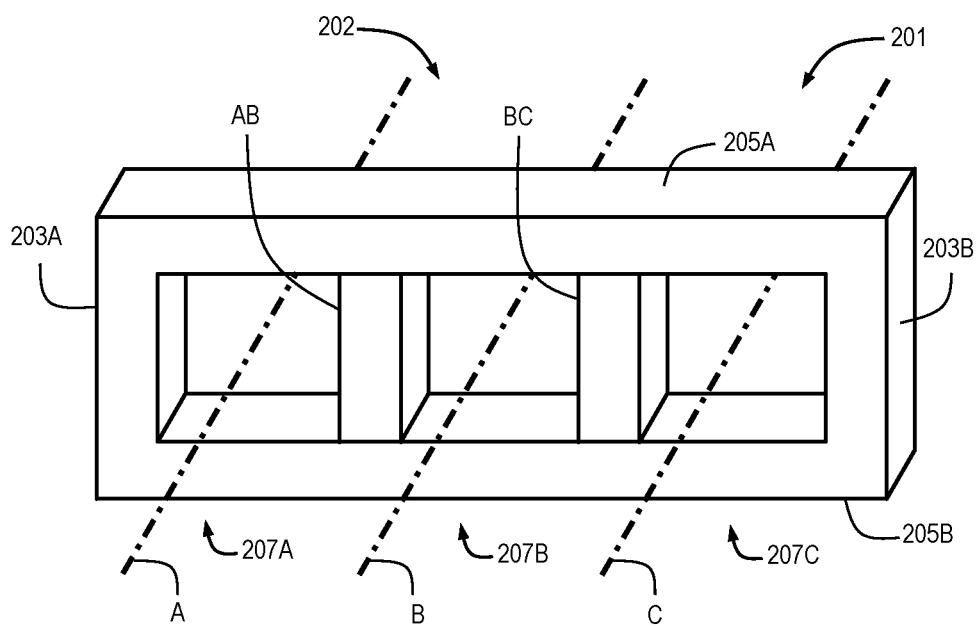
FIG. 3 illustrates an integrated core and current conductors, in accordance with one or more embodiments.

FIG. 3 illustrates an embodiment of a substantially rectangular common mode core 201 as illustrated in FIG. 1 including a pair of opposing short sides 203A and 203B and a pair of opposing long sides 205A and 205B.

Additionally, FIG. 3 illustrates three differential mode cores 207A, 207B and 207C surrounding, respectively, the conductors A, B and C. Differential mode core 207A includes the short side 203A, the leg AB between the long sides 205A and 205B, and lengths of long sides 205A and 205B between the short side 203A and the leg AB. Differential mode core 207B includes the leg AB and the leg BC between the long sides 205A and 205B, and lengths of long sides 205A and 205B between the leg AB and the leg BC. Differential mode core 207C includes the short side 203B, the leg BC between the long sides 205A and 205B, and lengths of long sides 205A and 205B between the short side 203B and the leg BC. Thus, it is appreciated that the differential mode cores 207A, 207B and 207C share some portion of the magnetic structure of the common mode core 201. The differential mode cores 207A, 207B and 207C are referred to as differential mode cores since individually they surround a single conductor A, B or C. For purposes of this disclosure, any core that surrounds a single conductor may be considered to be a differential mode core.

Figure 4:
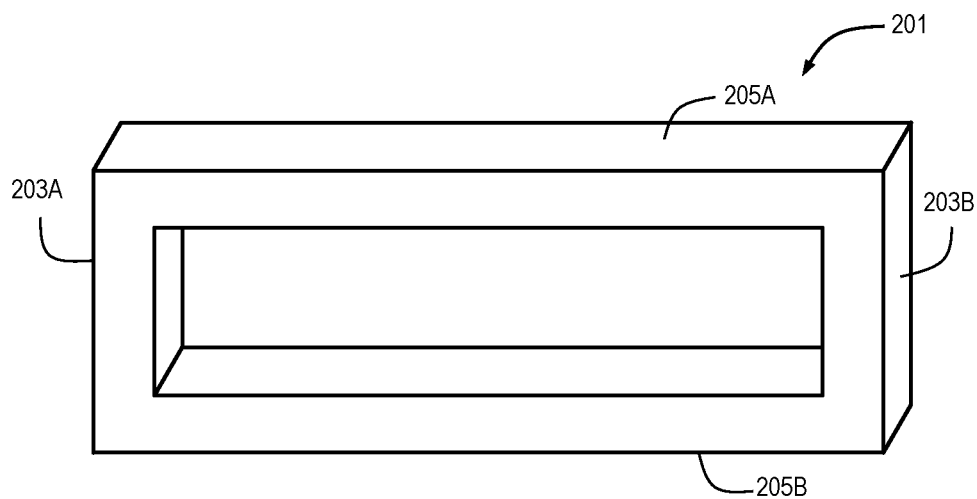
FIG. 4 illustrates a common mode core, in accordance with one or more embodiments.
Figure 5:
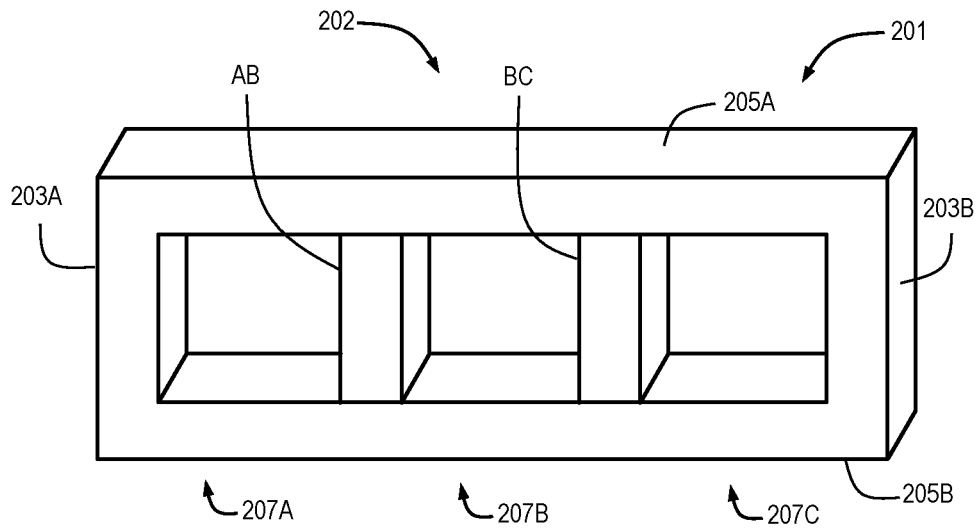
FIG. 5 illustrates an integrated core, in accordance with one or more embodiments.
Figure 6:
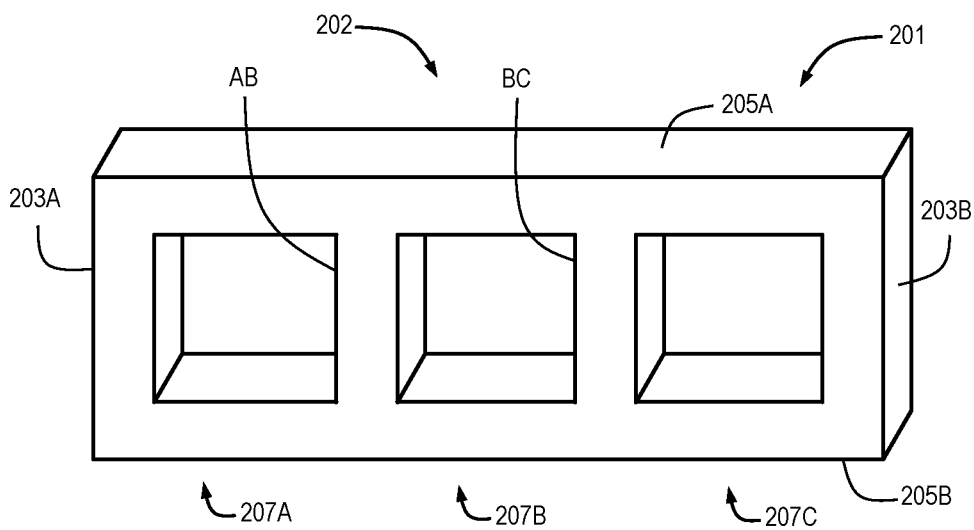
FIG. 6 illustrates an integrated core, in accordance with one or more embodiments.

From FIGS. 2 and 3 it is appreciated that an integrated core 202 may include both a common mode core and differential mode cores. FIGS. 4-6 are next referenced and illustrate the general core configurations set forth in FIGS. 2 and 3 without the additional detail of the conductors A, B and C. FIG. 4 illustrates the standalone embodiment of the common mode core 201 of FIG. 2, whereas FIGS. 5 and 6 illustrate the integrated core 202 embodiment of FIG. 3 including the common mode core 201 and the differential mode cores 207A, 207B and 207C. FIGS. 4-6 may include the same reference numbers as found in FIGS. 2 and 3 yet not all reference numbers may be referred to in the description of FIGS. 4-6.

Figure 11:
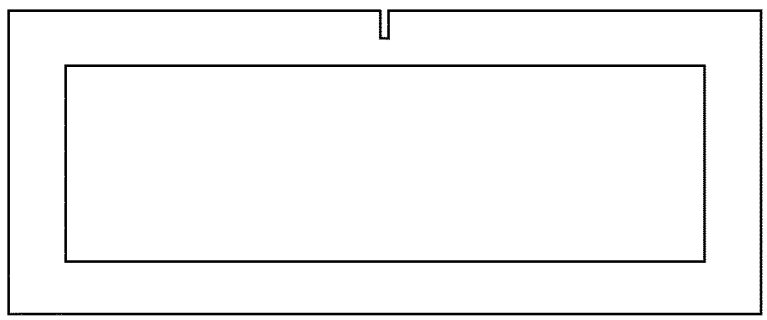
FIG. 11 illustrates an integrated core, in accordance with one or more embodiments.
Figure 11:
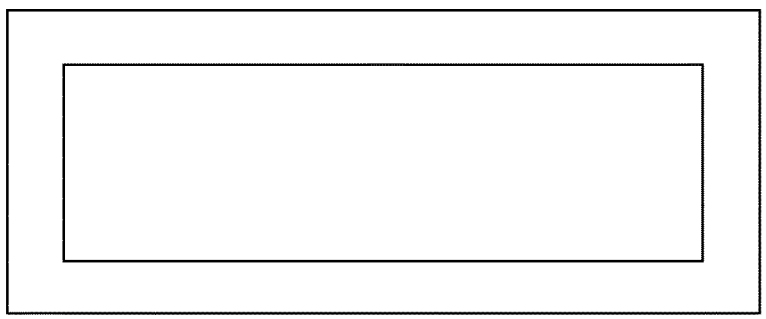
Figure 12A:
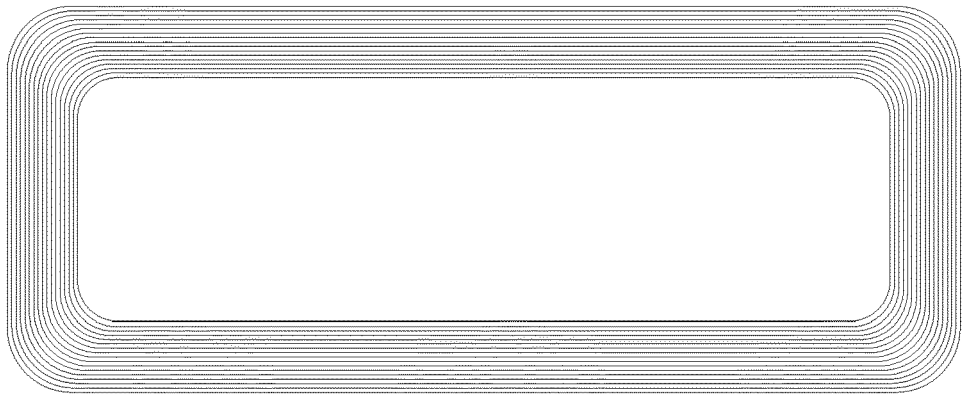
FIGS. 12A and 12B illustrate a common mode core, in accordance with one or more embodiments.
Figure 12B:
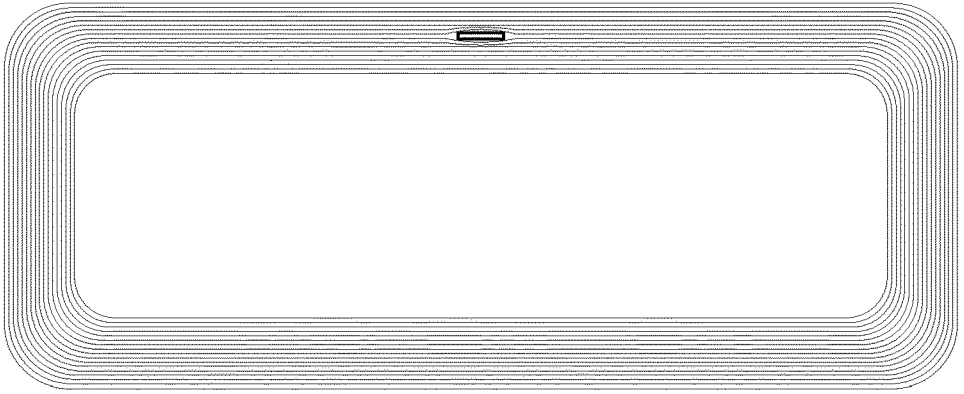

FIG. 4 illustrates an embodiment of a common mode core 201 that is unitary in construction. That is, the magnetic loop is unbroken and has no discrete air gap in the direction of magnetic flux which, for the purposes of this disclosure, is considered to be substantially aligned with an axis in the elongated direction of any of the sides 203A, 203B, 205A and 205B. Such unitary core construction of a common mode core 201 in an embodiment may be achieved with a stack of electrical steel laminations such as illustrated in FIG. 11 as described further herein. In another embodiment of unitary core construction, the common mode core 201 may be constructed from a molded ferrite. In another embodiment of unitary core construction, the common mode core 201 may be constructed from a wound Fe-based nanocrystalline ribbon such as illustrated in FIGS. 12A and 12B as described further herein.

Figure 7:
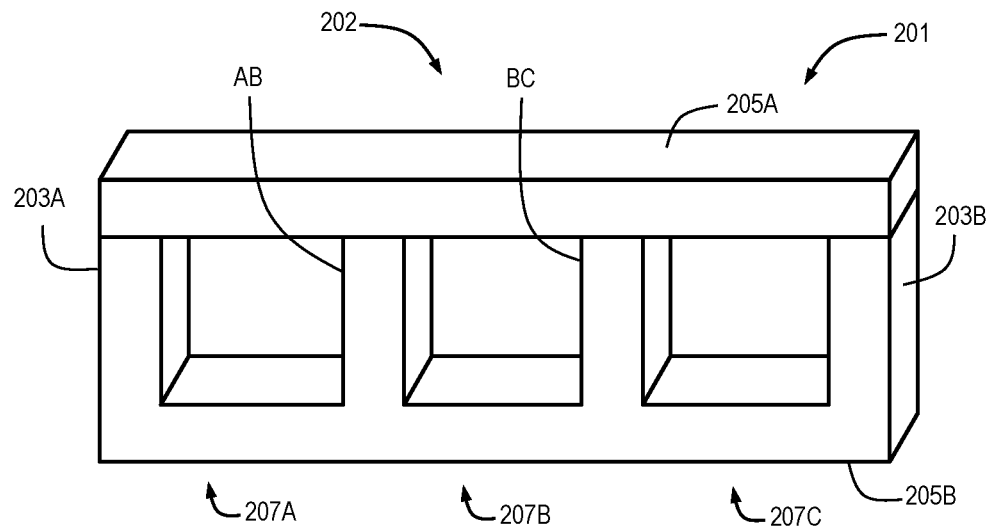
FIG. 7 illustrates an integrated core, in accordance with one or more embodiments.

FIG. 5 illustrates an embodiment of a piecewise-constructed integrated core 202 including both a common mode core 201 and differential mode cores 207A, 207B and 207C. That is, the legs AB and BC of the differential mode cores 207A, 207B and 207C are discrete from the common mode core 201 and are components that may be added to the common mode core 201 to define differential mode cores 207A, 207B and 207C together with the short side 203A and 203B, and lengths of the long sides 205A and 205B between adjacent ones of the short sides 203A and 203B and the legs AB and BC. Advantageously, such construction allows for flexibility in material selection and fabrication of the common mode core 201 and the legs AB and BC. Magnetic material may selectively differ between the common mode core and the legs AB and BC. The common mode core may desirably have a relatively high permeability compared to the permeability of the differential mode cores. The relatively low energy common mode currents coupling magnetic fields to the common mode core are not likely to saturate even a high permeability common mode core. Moreover, the common mode core, with relatively high permeability serves to provide high impedance via inductance on the path taken by common mode currents. The differential mode cores on the other hand may desirably require a relatively low permeability compared to the permeability of the common mode core since the relatively high energy differential mode currents coupling magnetic fields to the differential mode core are more likely to saturate higher permeability cores. This dichotomy in desirable materials where the differential mode cores share common mode magnetic paths may be addressed in an embodiment by selecting relatively low permeability material for the legs AB and BC compared to the permeability of the common mode core material. In another embodiment, an air gap may be introduced in the legs AB and BC to achieve a desired effective permeability of the differential mode cores. However, introducing physical air gaps are subject to fringing flux and associated losses. Thus, a ferrite material for the legs AB and BC may provide a viable alternative having a distributed air gap. In an embodiment, the common mode core may be constructed from a stack of electrical steel laminations such as illustrated in FIG. 11 as described further herein. In another embodiment, the common mode core 201 may be constructed from a molded ferrite. In another embodiment, the common mode core 201 may be constructed from a wound Fe-based nanocrystalline ribbon such as illustrated in FIGS. 12A and 12B as described further herein. The legs AB and BC of the differential mode cores 207A, 207B and 207C may, in an embodiment, be constructed from a stack of electrical steel laminations. In another embodiment, the legs AB and BC of the differential mode cores 207A, 207B and 207C may be constructed from a molded ferrite which may advantageously allow for a distributed air gap. In another embodiment, the legs AB and BC of the differential mode cores 207A, 207B and 207C may be constructed from a Fe-based nanocrystalline ribbon stack. The legs AB and BC may be pressed into a finished common mode core 201 with the ends defining a butt joint with the long sides 205A and 205B. The legs AB and BC may be mechanically retained by friction and compression forces and/or with an adhesive for example. The integrated core 202 of FIG. 5 is illustrated without any air gap at the butt joint interfaces of the legs AB and BC with the long sides 205A and 205B. However, an air gap may be introduced at either end of either leg AB or BC, in which case mechanical retention to the common mode core 201 may be limited to an end of the corresponding legs without an air gap and requiring mechanical fastening such as an adhesive. Alternatively, a piecewise constructed integrated core 202 as illustrated in FIG. 7 may provide component retention by assembly to a dielectric case or a dielectric overmold (not shown). Such separate mechanical retention may further allow for air gaps at the free ends of all of the legs AB and BC and the short sides 230A and 203B. Thus, it is appreciated that various combinations of material and manufacturing may be realized in the piecewise construction of an integrated core 202 including both a common mode core 201 and differential mode cores 207A, 207B and 207C as illustrated in FIG. 7.

FIG. 6 illustrates an embodiment of an integrated core 202 including both a common mode core 201 and differential mode cores 207A, 207B and 207C that is unitary in construction. That is, the magnetic loops are unbroken and have no discrete air gaps in the direction of magnetic flux which, for the purposes of this disclosure, is considered to be substantially aligned with an axis in the elongated direction of any of the sides 203A, 203B, 205A and 205B or legs AB and BC. Such unitary core construction of the integrated core 202 in an embodiment may be achieved with a stack of electrical steel laminations. Advantageously, portions of the laminations corresponding to the legs AB and BC may be gapped or slotted to increase the effective permeability locally through the legs AB and BC. In another embodiment of unitary core construction, the integrated core 202 may be constructed from a molded ferrite. Advantageously, the legs AB and BC may be molded from a ferrite having lower permeability than that of the common mode core 201 to effect differential mode cores 207A, 207B and 207C relatively low permeability material compared to the permeability of the common mode core 201 as discussed further herein. Thus, as with the embodiment of FIG. 5, the common mode core may desirably have a relatively high permeability compared to the permeability of the differential mode cores. The relatively low energy common mode currents coupling magnetic fields to the common mode core are not likely to saturate even a high permeability common mode core. Moreover, the common mode core, with relatively high permeability serves to provide high impedance via inductance on the path taken by common mode currents. The differential mode cores on the other hand may desirably require a relatively low permeability compared to the permeability of the common mode core since the relatively high energy differential mode currents coupling magnetic fields to the differential mode core are more likely to saturate higher permeability cores.

FIG. 7 illustrates an embodiment of an integrated core 202 including both a common mode core 201 and differential mode cores 207A, 207B and 207C that is piecewise in construction. That is, a first component of the integrated core 202 includes one of the long sides 205B and both short sides 203A and 203B of the common mode core 201, and the legs AB and BC of the differential mode cores 207A, 207B and 207C. A second component of the integrated core 202 includes the other long side 205A of the common mode core 201. Advantageously, such construction allows for flexibility in material selection and fabrication of the components of the integrated core 202. In an embodiment, the first component of the integrated core 202 may be constructed from a stack of electrical steel laminations. In another embodiment, the first component may be constructed from a molded ferrite which may advantageously allow for a distributed air gap. The second component of the integrated core 202 may, in an embodiment, be constructed from a stack of electrical steel laminations. In another embodiment, the second component of the integrated core 202 may be constructed from a molded ferrite which may advantageously allow for a distributed air gap. In another embodiment, the second component of the integrated core 202 may be constructed from a Fe-based nanocrystalline ribbon stack. The short sides 203A and 203B of the common mode core 201, and the legs AB and BC of the differential mode cores 207A, 207B and 207C have free ends defining a butt joint with the long side 205A of the common mode core 201. The free ends of the legs AB and BC and the short sides 203A and 203B may be mechanically retained to the long side 205A with an adhesive for example. The integrated core 202 of FIG. 7 is illustrated without any air gap at the butt joint interfaces of the legs AB and BC and short sides 203A and 203B with the long side 205A. However, air gaps may be introduced at the free ends of the legs AB and BC and short sides 203A and 203B, in which case mechanical retention of the first component to the second component may be limited to interfaces at the free ends of corresponding legs AB and BC and/or short sides 203A and 203B without an air gap and requiring mechanical fastening such as an adhesive. Alternatively, the piecewise constructed integrated core 202 of FIG. 7 may provide component retention by assembly to a dielectric case or a dielectric overmold (not shown). Such separate mechanical retention may further allow for air gaps to be introduced at all free ends of the legs AB and BC and short ends 203A and 203B. Thus, it is appreciated that various combinations of material and manufacturing may be realized in the piecewise construction of an integrated core 202 including both a common mode core 201 and differential mode cores 207A, 207B and 207C as illustrated in FIG. 7.

Figure 8:
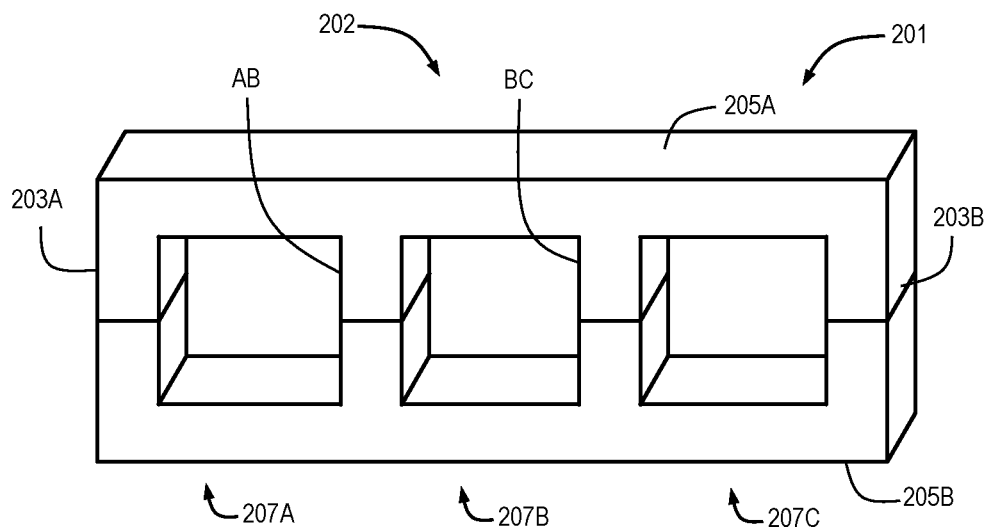
FIG. 8 illustrates an integrated core, in accordance with one or more embodiments.

FIG. 8 illustrates an embodiment of an integrated core 202 including both a common mode core 201 and differential mode cores 207A, 207B and 207C that is piecewise in construction. That is, a first component of the integrated core 202 includes the long side 205B and truncated portions of both short sides 203A and 203B of the common mode core 201, and the legs AB and BC of the differential mode cores 207A, 207B and 207C. A second component of the integrated core 202 includes the long side 205A and truncated portions of both short sides 203A and 203B of the common mode core 201, and the legs AB and BC of the differential mode cores 207A, 207B and 207C. In an embodiment, the first and second components may be substantially identical. Advantageously, such construction allows for flexibility in material selection and fabrication of the components of the integrated core 202. In an embodiment, the first and second components of the integrated core 202 may be constructed from respective stacks of electrical steel laminations. In another embodiment, the first and second component may be constructed from molded ferrite which may advantageously allow for distributed air gaps. The truncated portions of the short sides 203A and 203B of the common mode core 201, and the legs AB and BC of the differential mode cores 207A, 207B and 207C of each of the first and second components are complementary and are arranged such that the free ends interface at butt joints. The first and second components may be mechanically joined at the butt joints with an adhesive for example. The integrated core 202 of FIG. 8 is illustrated without any air gap at the butt joint interfaces of the truncated portions of legs AB and BC and short sides 203A and 203B. However, air gaps may be introduced at the free ends of the legs AB and BC and short sides 203A and 203B, in which case mechanical retention of the first component to the second component may be limited to interfaces at the free ends of the corresponding truncated portions of legs AB and BC and/or short sides 203A and 203B without an air gap and requiring mechanical fastening such as an adhesive. Alternatively, the piecewise constructed integrated core 202 of FIG. 8 may provide component retention by assembly to a dielectric case or a dielectric overmold (not shown). Such separate mechanical retention may further allow for air gaps to be introduced at all free ends of the truncated portions of legs AB and BC and short ends 203A and 203B. Thus, it is appreciated that various combinations of material and manufacturing may be realized in the piecewise construction of an integrated core 202 including both a common mode core 201 and differential mode cores 207A, 207B and 207C as illustrated in FIG. 8.

The various embodiments of an integrated core 202 including both a common mode core 201 and differential mode cores 207A, 207B and 207C disclosed in conjunction with FIGS. 5-8 are understood to be exemplary and not limiting. Alternative constructions may be apparent to those skilled in the art in view of the exemplary embodiments.

Figure 9A:
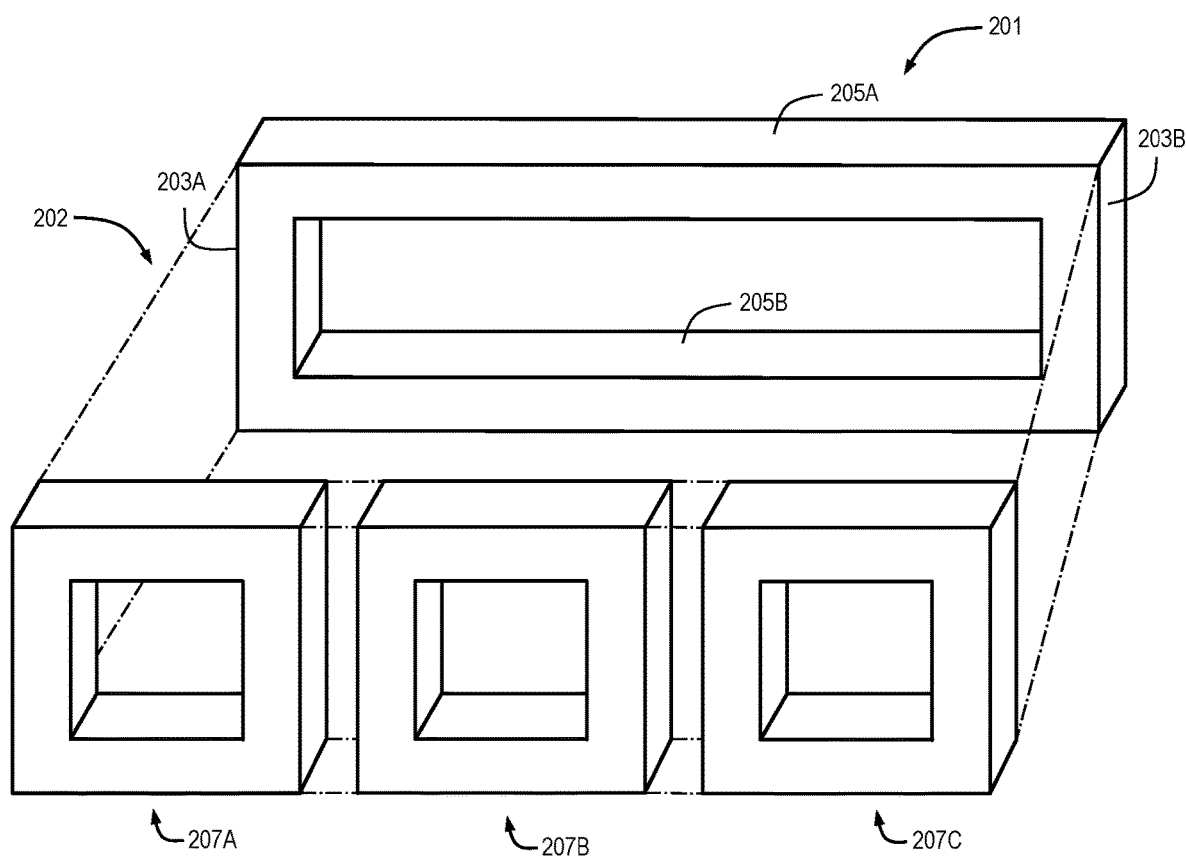
FIGS. 9A and 9B illustrate an integrated core, in accordance with one or more embodiments.
Figure 9B:
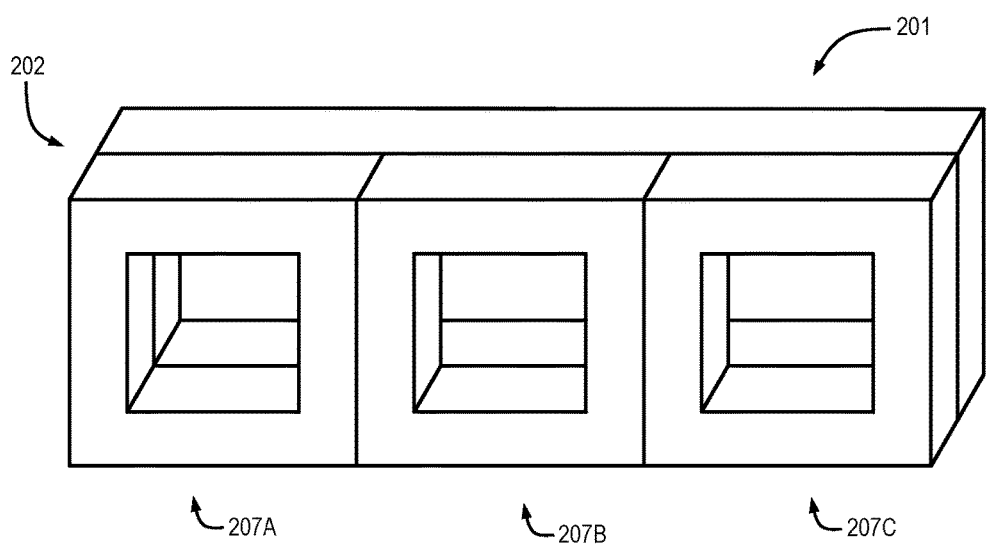

FIGS. 9A and 9B illustrate an embodiment of an integrated core 202 including both a common mode core 201 and differential mode cores 207A, 207B and 207C. The integrated core 202 of FIGS. 9A and 9B includes a discrete common mode core 201 and discrete differential mode cores 207A, 207B and 207C. The common mode core 201 and the differential mode cores 207A, 207B and 207C are referred to as discrete cores since they do not share common magnetic structure. The common mode core 201 is substantially rectangular and includes a pair of opposing short sides 203A and 203B and a pair of opposing long sides 205A and 205B. No portion of the magnetic structure that is the common mode core 201 is also part of any of the differential mode cores 207A, 207B and 207C. Similarly, no portion of the magnetic structure of any differential mode core 207A, 207B or 207C is also part of any other differential mode core or of the common mode core 201. Advantageously, magnetic material may selectively differ between the common mode core and the differential mode cores. The common mode core may have a relatively high permeability compared to the permeability of the differential mode cores. The relatively low energy common mode currents coupling magnetic fields to the common mode core are not likely to saturate even a high permeability common mode core. The differential mode cores on the other hand may require a relatively low permeability compared to the permeability of the common mode core since the relatively high energy differential mode currents coupling magnetic fields to the differential mode core are more likely to saturate higher permeability cores.

FIG. 9A is a disassembled view of the embodiment of integrated core 201 illustrated in FIG. 9B. An assembled integrated core 202 therefore includes the common mode core 201 and the three adjacent differential mode cores 207A, 207B and 207C stacked as illustrated in FIG. 9B. The common mode core 201 and the differential mode cores 207A, 207B and 207C may be constructed as described in detail with reference to FIG. 4. Thus, common mode core 201 and the differential mode cores 207A, 207B and 207C may be constructed as unitary cores in an embodiment with a stack of electrical steel laminations, with or without air gaps. In another embodiment of unitary core construction, the common mode core 201 and the differential mode cores 207A, 207B and 207C may be constructed from a molded ferrite which may advantageously allow for a distributed air gap and control of the effective permeability of the core. In another embodiment of unitary core construction, the common mode core 201 and the differential mode cores 207A, 207B and 207C may be constructed from a wound Fe-based nanocrystalline ribbon. In an embodiment, the differential mode cores 207A, 207B and 207C may not provide a closed loop by virtue of designed air gaps. Differential mode cores in another embodiment may be partial or U-shaped, functioning primarily to shield corresponding sensing elements as opposed to providing flux concentration. The adjacent differential mode cores 207A, 207B and 207C may include a thin dielectric separator therebetween (not shown) which may reduce magnetic coupling therebetween. Similarly, the common mode core 201 and the differential mode cores 207A, 207B and 207C may include a thin dielectric separator therebetween. Such a dielectric separator may simply be a thin sheet of plastic or paper, a varnish or an adhesive layer that mechanically fastens the common mode core 201 and the differential mode cores 207A, 207B and 207C. Dielectric separators may be redundant in the case of non-conductive construction of the magnetic structures, for example ferrite cores. The integrated core 202, including the common mode core 201 and the differential mode cores 207A, 207B and 207C may be encased in a dielectric such as an overmolded plastic. Advantageously, co-packaging of the common mode and differential mode cores may result in a reduced volumetric footprint compared to separate packaging.

Having thus described various embodiments of core structures, integration of sensing elements such as hall effect or magneto resistive sensing elements, with the core structures is addressed with reference to exemplary embodiments of FIGS. 10A-10E, FIG. 11 and FIGS. 12A and 12B. With reference to FIGS. 10A through 10E, sensing elements 301 may include a body 303 and electrical leads 305. Generally, sensing elements 301 placement may be outside of a core (e.g., surface mounted to the core) or internally mounted within a core and embedded within the core's concentrated flux path. Sensing elements that are either mounted in a core or on a core are considered to be proximate the core. It is understood that when sensing element 301 are proximate a common mode core, common mode currents may be sensed. Similarly, it is understood that when sensing element 301 are proximate a differential mode core, differential mode currents may be sensed. Differential mode cores associated with AC buses may be used to sense the respective phase currents through the AC bus conductors of the AC bus, whereas differential mode cores associated with DC buses may be used to sense the respective DC currents through the DC bus conductors of the DC bus. Known magnetic field decoupling techniques may be employed for accurate current sensing particularly in embodiments where the differential mode cores share some portion of the magnetic structure of the common mode core.

Figure 10A:
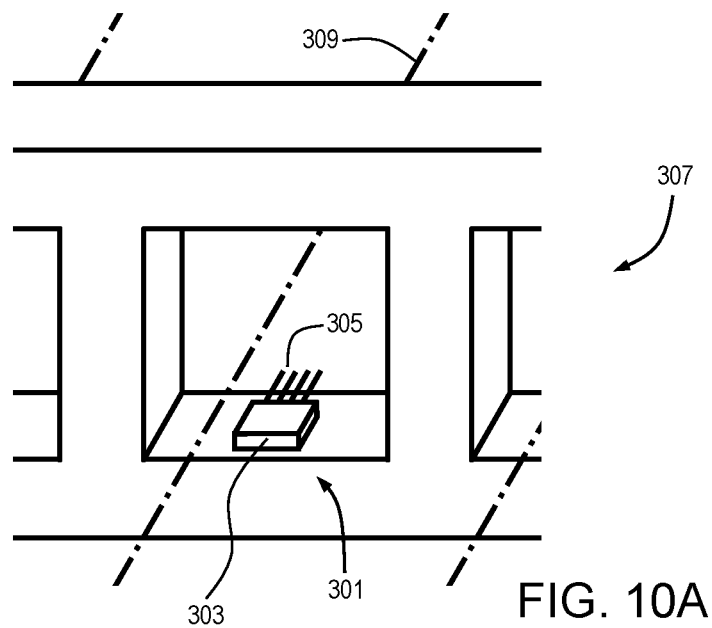
FIGS. 10A through 10E illustrate sensing element placement, in accordance with one or more embodiments.

FIG. 10A illustrates an embodiment of a surface mounting of the sensing element 301 upon a portion of a core 307. Considering the need for exposure of the sensing element 301 to the magnetic field associated with common mode or differential currents, the sensing element may be surface mounted to a surface of the core 307 that is exposed to or circumscribing one or more conductors 309. Alternatively, the sensing element 301 may not be directly surface mounted to the core but mounted in spaced adjacency thereto, for example on the outside of an overmolded cover of the core 307. Sensing elements that are in spaced adjacency with the core may still be considered as proximate the core. Such surfaces may be referred to as inner surfaces of the core. Advantageously, such placement of the sensing element 301 outside of the core 307 but circumscribed thereby may provide core structure shielding of the sensing element 301. In this embodiment, the body 303 of sensing element 301 may be adhesively affixed to the surface of the core 307 and sensing element leads 305 extending beyond the core 307 for external connection.

Figure 10B:
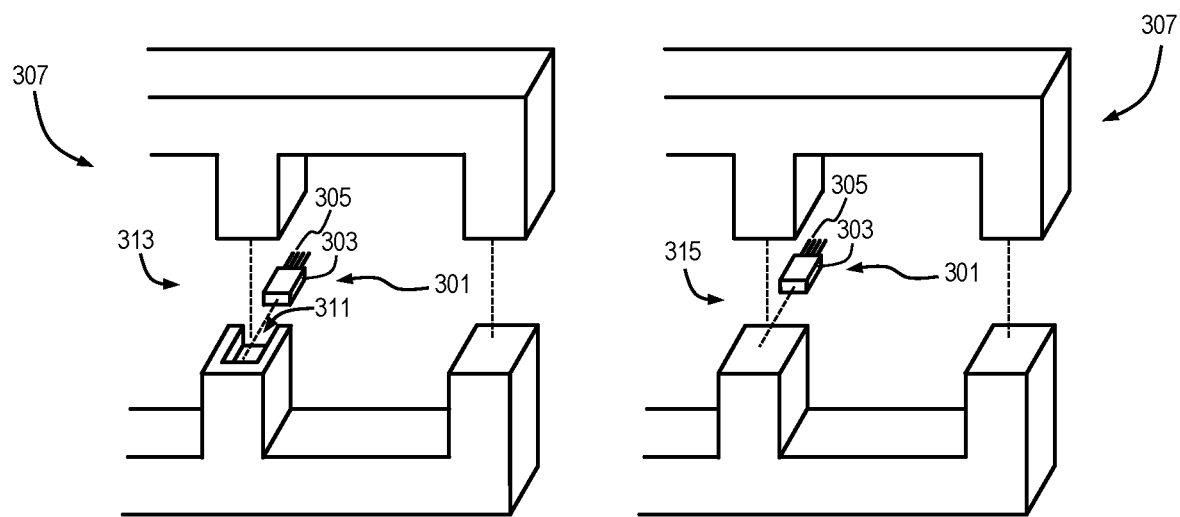

FIG. 10B illustrates two embodiments of an internal mounting of the sensing element 301. In one embodiment of FIG. 10B, a pocket 311 may be formed at the free end of a portion of the core 307 at a butt joint 313 and the sensing element 301 placed therein. Advantageously, such placement may provide core concentrated flux to the sensing element 301. In this embodiment, the body 303 of sensing element 301 may be adhesively affixed or potted within the pocket 311 with sensing element leads 305 extending beyond the core 307 for external connection. In another embodiment of FIG. 10B, no pocket may be formed at the free ends of a portion of the core 307 at a gap 315 and the sensing element 301 is merely contained within the gap 315. Advantageously, such placement may provide core concentrated flux to the sensing element 301 yet does not require more complicated manufacturing of a pocket. In this embodiment, the body 303 of sensing element 301 may be adhesively affixed or potted within the gap 315 with sensing element leads 305 extending beyond the core 307 for external connection.

Figure 10E:
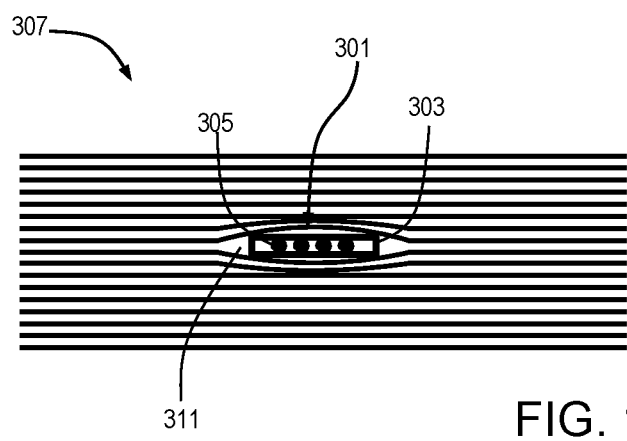
Figure 10C:
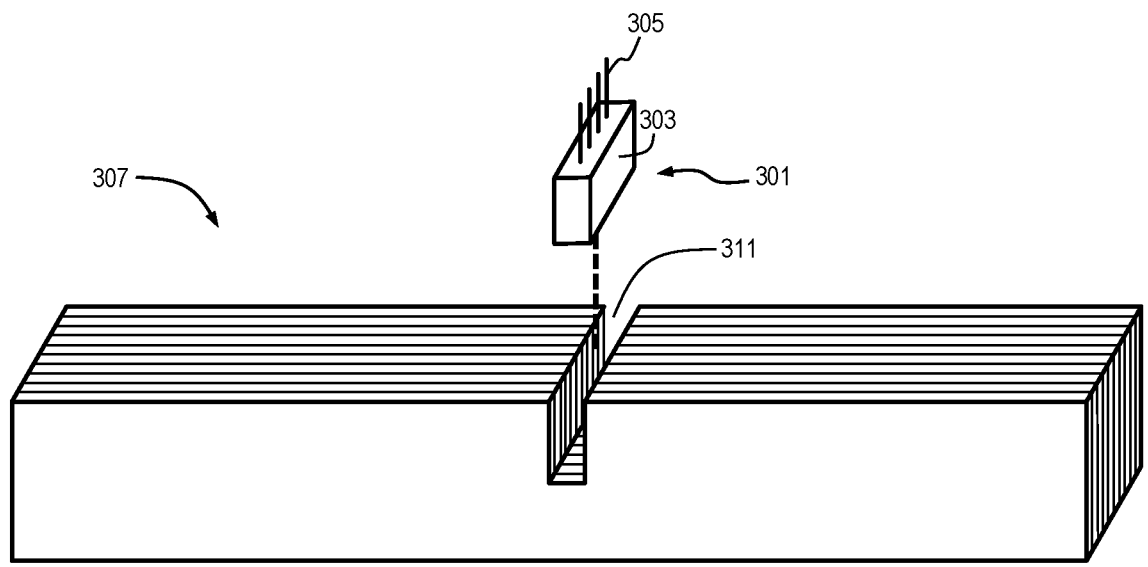

FIG. 10C illustrates an embodiment of an internal mounting of the sensing element 301. In FIG. 10C, a pocket 311 may be formed within a portion of the core 307. In the embodiment of FIG. 10C, the core may include a plurality of notched and unnotched laminations (e.g., see laminations in FIG. 11) selectively stacked to form the pocket 311. Advantageously, such placement may provide core concentrated flux to the sensing element 301. In this embodiment, the body 303 of sensing element 301 may be adhesively affixed or potted within the pocket 311 with sensing element leads 305 extending beyond the core 307 for external connection.

Figure 10D:
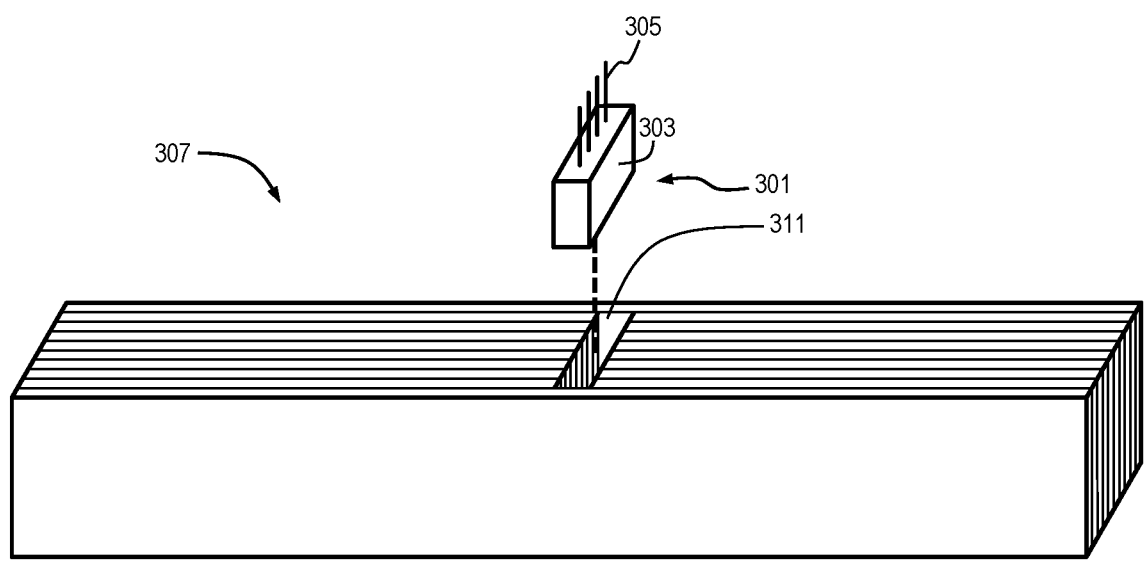

FIG. 10D illustrates an embodiment of an internal mounting of the sensing element 301. In FIG. 10C, a pocket 311 may be formed within a portion of the core 307 as a through slot. Advantageously, such placement may provide core concentrated flux to the sensing element 301. In this embodiment, the body 303 of sensing element 301 may be adhesively affixed or potted within the pocket 311 with sensing element leads 305 extending beyond the core 307 for external connection.

FIG. 10E illustrates an embodiment of an internal mounting of the sensing element 301. In the embodiment of FIG. 10E, the core 307 may include multiple windings of magnetic ribbon such as, for example, nanocrystalline ribbon (e.g., see FIGS. 12A and 12B) selectively wound to enclose the sensing element 301 between adjacent layers of the ribbon. Advantageously, such placement may provide core concentrated flux to the sensing element 301. In this embodiment, the body 303 of sensing element 301 may be adhesively affixed or potted within the pocket 311 with sensing element leads 305 extending beyond the core 307 for external connection.

FIGS. 10A-10E are non-limiting exemplary embodiments of sensing element 301 placements at various areas of the core 307 including, for example, at one or more opposing short sides 203A and 203B, opposing long sides 205A and 207A, legs AB and BC, or any combination thereof. Placement of sensing pockets 311 within the cores 307 may be formed, for example, through geometric features in a lamination stack or a ferrite core. Pockets in ferrite cores may formed during molding with a mold insert for example, or subsequent to mold formation via material removal mechanically (e.g., cutting/grinding), concentrated heat application (e.g., laser ablation) or chemically (e.g., etching), for example.

The terminology used herein is for the purpose of describing particular embodiments only and is not intended to be limiting. The terms "a" and "an" do not denote a limitation of quantity, but rather denote the presence of at least one of the referenced items. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

All numeric values herein are assumed to be modified by the term "about" whether or not explicitly indicated. For the purposes of the present disclosure, ranges may be expressed as from "about" one particular value to "about" another particular value. The term "about" generally refers to a range of numeric values that one of skill in the art would consider equivalent to the recited numeric value, having the same function or result, or reasonably within manufacturing tolerances of the recited numeric value generally. Similarly, numeric values set forth herein are by way of non-limiting example and may be nominal values, it being understood that actual values may vary from nominal values in accordance with environment, design and manufacturing tolerance, age and other factors.

When an element such as a layer, film, region, or substrate is referred to as being "on" another element, it can be directly on the other element or intervening elements may also be present. In contrast, when an element is referred to as being "directly on" another element, there are no intervening elements present. Therefore, unless explicitly described as being "direct," when a relationship between first and second elements is described in the above disclosure, that relationship may be a direct relationship where no other intervening elements are present between the first and second elements but may also be an indirect relationship where one or more intervening elements are present (either spatially or functionally) between the first and second elements.

One or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Unless defined otherwise, technical and scientific terms used herein have the same meaning as is commonly understood by one of skill in the art to which this disclosure belongs.

Unless specified to the contrary herein, all test standards are the most recent standard in effect as of the filing date of this application, or, if priority is claimed, the filing date of the earliest priority application in which the test standard appears.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. A current sensing apparatus, comprising:
    a common mode core surrounding two or more current conductors, wherein the common mode core defines an unbroken magnetic loop having no discrete air gap in a direction of magnetic flux;
    a plurality of differential mode cores sharing common magnetic structure with the common mode core, wherein each differential mode core includes a respective current sensing element proximate the corresponding differential mode core; and
    a current sensing element proximate the common mode core.

2. The current sensing apparatus of claim 1 wherein the current sensing element is within the common mode core for measuring a common mode current of the two or more current conductors.

3. The current sensing apparatus of claim 1 wherein the current sensing element is outside the common mode core for measuring a differential mode current of one of the Canceled or more current conductors.

4. The current sensing apparatus of claim 1 wherein the respective current sensing elements are within the corresponding differential mode cores for measuring differential mode currents of the two or more current conductors.

5. The current sensing apparatus of claim 1 wherein the respective current sensing elements are outside the corresponding differential mode cores for measuring differentials mode currents of the two or more current conductors.

6. The current sensing apparatus of claim 1 further comprising a plurality of differential mode cores not sharing common magnetic structure with the common mode core, wherein each differential mode core includes a respective current sensing element proximate the corresponding differential mode core.

7. The current sensing apparatus of claim 6 wherein the respective current sensing elements are within the corresponding differential mode cores for measuring differential mode currents of the two or more current conductors.

8. The current sensing apparatus of claim 6 wherein the respective current sensing elements are outside the corresponding differential mode cores for measuring differentials mode currents of the two or more current conductors.

9. The current sensing apparatus of claim 6 wherein each of the plurality of differential mode cores does not share common magnetic structure with any other of the plurality of the differential mode cores.

10. The current sensing apparatus for the electrified vehicle of claim 1, wherein each of the differential mode cores has a lower permeability than a permeability of the common mode core.

11. A current sensing apparatus for an electrified vehicle, comprising:
    a traction power inverter module ("TPIM") configured to change a direct current ("DC") voltage on a DC bus to a multi-phase alternating current ("AC") voltage on an AC bus;
    a common mode core surrounding one of the DC bus and the AC bus, wherein the common mode core defines an unbroken magnetic loop having no discrete air gap in a direction of magnetic flux;
    a plurality of differential mode cores not sharing common magnetic structure with the common mode core, wherein each differential mode core includes a respective current sensing element proximate the corresponding differential mode core; and
    a current sensing element proximate the common mode core.

12. The current sensing apparatus for an electrified vehicle of claim 11 further comprising a plurality of differential mode cores sharing common magnetic structure with the common mode core, wherein each differential mode core includes a respective current sensing element proximate the corresponding differential mode core.

13. The current sensing apparatus for an electrified vehicle of claim 12 wherein the respective current sensing elements are within the corresponding differential mode cores for measuring differential mode currents of the one of the DC bus and the AC bus.

14. The current sensing apparatus for an electrified vehicle of claim 12 wherein the respective current sensing elements are outside the corresponding differential mode cores for measuring differentials mode currents of the one of the DC bus and the AC bus.

15. The current sensing apparatus for an electrified vehicle of claim 11 wherein the respective current sensing elements are within the corresponding differential mode cores for measuring differential mode currents of the one of the DC bus and the AC bus.

16. The current sensing apparatus for an electrified vehicle of claim 11 wherein the respective current sensing elements are outside the corresponding differential mode cores for measuring differentials mode currents of the one of the DC bus and the AC bus.

17. The current sensing apparatus for an electrified vehicle of claim 11 wherein each of the plurality of differential mode cores does not share common magnetic structure with any other of the plurality of the differential mode cores.

18. A current sensing apparatus for an electrified vehicle, comprising:
    a traction power inverter module ("TPIM") configured to change a direct current ("DC") voltage on a DC bus to a multi-phase alternating current ("AC") voltage on an AC bus having a plurality of current conductors;
    an integrated core including a common mode core and a plurality of differential mode cores, wherein the common mode core defines an unbroken magnetic loop having no discrete air gap in a direction of magnetic flux, the common mode core surrounding all current conductors of the AC bus, the plurality of differential mode cores not sharing common magnetic structure with the common mode core, wherein each differential mode core includes a respective current sensing element proximate the corresponding differential mode core, and each of the plurality of differential mode cores surrounding a respective one of the plurality of the current conductors of the AC bus; and a respective differential mode current sensing element proximate each differential mode core for measuring a corresponding differential mode current of the respective one of the plurality of the current conductors of the AC bus surrounded by the corresponding differential mode core.

19. The current sensing apparatus for an electrified vehicle of claim 18 further comprising a common mode current sensing element proximate the common mode core for measuring a common mode current of the plurality of the current conductors of the AC bus surrounded by the common mode core.

20. The current sensing apparatus of claim 11, wherein each of the differential mode cores has a lower permeability than a permeability of the common mode core.

* * * * *